US010389239B2

(12) United States Patent
Sugimoto et al.

(10) Patent No.: US 10,389,239 B2
(45) Date of Patent: Aug. 20, 2019

(54) POWER CONVERSION DEVICE WITH PROTECTION DEVICE AND METHOD OF CONTROLLING THE SAME

(71) Applicants: FURUKAWA ELECTRIC CO., LTD., Tokyo (JP); FURUKAWA AUTOMOTIVE SYSTEMS INC., Inukami-gun (JP)

(72) Inventors: Kaoru Sugimoto, Tokyo (JP); Ryosuke Tamura, Tokyo (JP); Shusuke Kaya, Tokyo (JP); Takezo Sugimura, Tokyo (JP)

(73) Assignees: FURUKAWA ELECTRIC CO., LTD., Tokyo (JP); FURUKAWA AUTOMOTIVE SYSTEMS INC., Inukami-gun (JP)

( * ) Notice: Subject to any disclaimer, the term of this patent is extended or adjusted under 35 U.S.C. 154(b) by 0 days.

(21) Appl. No.: 15/668,079

(22) Filed: Aug. 3, 2017

(65) Prior Publication Data

US 2017/0331369 A1 Nov. 16, 2017

Related U.S. Application Data

(63) Continuation of application No. PCT/JP2016/060506, filed on Mar. 30, 2016.

(30) Foreign Application Priority Data

Mar. 31, 2015 (JP) .................................. 2015-073455

(51) Int. Cl.
*H02M 1/32* (2007.01)
*H02M 3/155* (2006.01)
(Continued)

(52) U.S. Cl.
CPC ............. *H02M 3/155* (2013.01); *H02M 1/32* (2013.01); *H02M 3/06* (2013.01); *H02M 3/156* (2013.01);
(Continued)

(58) Field of Classification Search
CPC ........ H02M 1/32; H02M 3/155; H02M 3/156; H02M 3/02; H02M 3/06; H02M 3/08;
(Continued)

(56) References Cited

U.S. PATENT DOCUMENTS 6,011,416 A * 1/2000 Mizuno .............. H03K 17/0822
327/108
7,839,131 B2 * 11/2010 Yang .................... H02M 3/1588
323/282
(Continued)

FOREIGN PATENT DOCUMENTS

CN 101335449 A 12/2008
CN 101447731 A 6/2009
(Continued)

OTHER PUBLICATIONS

International Search Report dated Jun. 21, 2016 in PCT/JP2016/060506, filed on Mar. 30, 2016 (with English translation).
(Continued)

*Primary Examiner* — Adolf D Berhane
*Assistant Examiner* — Jye-June Lee
(74) *Attorney, Agent, or Firm* — Oblon, McClelland, Maier & Neustadt, L.L.P.

(57) ABSTRACT

A power conversion device converting and outputting a characteristic of input power, includes: a power conversion unit including a normally-on type first switching element made of a nitride-based semiconductor material and converting the characteristic of power by a switching operation performed by the first switching element; an operation control unit controlling a switching operation of the first switching element; and an intelligent power switch including: a second switching element provided on a power input side of the power conversion unit and turning on/off power input to the power conversion unit; and a protection control unit including a current detection unit detecting a current flowing in the second switching element and controlling
(Continued)

on/off of the second switching element and turn off the second switching element in a case where a current detected by the current detection unit exceeds a threshold value.

6 Claims, 5 Drawing Sheets

(51) Int. Cl.
    *H02M 3/06*     (2006.01)
    *H02M 3/156*     (2006.01)
    *H03K 17/082*     (2006.01)
    *H03K 17/687*     (2006.01)

(52) U.S. Cl.
    CPC . *H03K 17/0822* (2013.01); *H03K 2017/6875* (2013.01)

(58) Field of Classification Search
    CPC .... H03K 17/0822; H02H 3/087; H02H 3/093; H02H 3/0935; H02H 7/1213
    See application file for complete search history.

(56) References Cited

U.S. PATENT DOCUMENTS

| | | | | |
|---|---|---|---|---|
| 9,787,079 | B2* | 10/2017 | Renaud | H02H 3/02 |
| 2002/0171405 | A1* | 11/2002 | Watanabe | H02M 3/00 |
| | | | | 323/282 |
| 2008/0122418 | A1* | 5/2008 | Briere | H02M 3/1588 |
| | | | | 323/282 |
| 2009/0002901 | A1 | 1/2009 | Matsumoto et al. | |
| 2011/0080156 | A1* | 4/2011 | Briere | H02M 1/32 |
| | | | | 323/351 |
| 2013/0320766 | A1 | 12/2013 | Ishishita et al. | |
| 2014/0192441 | A1 | 7/2014 | Briere et al. | |
| 2014/0268939 | A1 | 9/2014 | Tomas et al. | |
| 2014/0277802 | A1 | 9/2014 | Tomas et al. | |
| 2017/0294922 | A1* | 10/2017 | Illing | H03M 1/38 |
| 2017/0365995 | A1* | 12/2017 | Bahl | H02M 1/32 |
| 2018/0041022 | A1* | 2/2018 | Fukui | H02H 3/087 |

FOREIGN PATENT DOCUMENTS

| | | |
|---|---|---|
| CN | 104052258 A | 9/2014 |
| EP | 0860946 A2 | 8/1998 |
| EP | 2330728 A1 | 6/2011 |
| JP | 9-284994 | 10/1997 |
| JP | 2002-101547 | 4/2002 |
| JP | 5567508 | 8/2014 |

OTHER PUBLICATIONS

Written Opinion dated Jun. 21, 2016 in PCT/JP2016/060506, filed on Mar. 30, 2016.

Extended European Search Report dated Oct. 5, 2018 in Patent Application No. 16773030.8.

Chinese Office Action dated Dec. 10, 2018 in Chinese Patent Application No. 201680013541.5 with computer-generated translation.

* cited by examiner

POWER CONVERSION DEVICE WITH PROTECTION DEVICE AND METHOD OF CONTROLLING THE SAME

CROSS-REFERENCE TO RELATED APPLICATION(S)

The present application claims priority to and incorporates by reference the entire contents of PCT International Application No. PCT/JP2016/060506 filed on Mar. 30, 2016.

BACKGROUND

The present disclosure relates to a power conversion device and a method of controlling the same.

An exemplary power conversion device which converts and outputs a characteristic of input power is a DC-DC converter. It is known that when a constituent material of a switching element used in a step-up circuit or the like of a DC-DC converter is replaced with a wide band gap (WBG) semiconductor such as a nitride-based semiconductor (e.g., GaN-based semiconductor), there are advantages that a switching element can be downsized and has a low loss, for example. Additionally, as for a semiconductor device formed of the GaN-based semiconductor, a normally-on type has better switching performance than a normally-off type does. For example, it is known that a high-performance product can be relatively easily manufactured at low cost because the normally-on type has gate capacity smaller than the normally-off type does, also can reduce on-resistance, and can achieve high-speed switching operation.

However, in the case of using the normally-on type GaN-based semiconductor device as a switching element of a power conversion device, a high current may flow between a drain and a source of the switching element when a failure occurs at a gate drive unit thereof, and the failure may be further expanded in terms of an area and a level.

To prevent the switching element from high current flow, disclosed is a configuration in which a protection device is provided on an upstream side of a power conversion device (see, for example, Japanese Patent No. 5567508).

SUMMARY

To resolve the above-described problem and achieve the object, according to an embodiment of the present disclosure, a power conversion device converting and outputting a characteristic of input power, includes a power conversion unit including a normally-on type first switching element made of a nitride-based semiconductor material and converting the characteristic of power by a switching operation performed by the first switching element; an operation control unit controlling a switching operation of the first switching element; and an intelligent power switch including a second switching element provided on a power input side of the power conversion unit and turning on/off power input to the power conversion unit; and a protection control unit including a current detection unit detecting a current flowing in the second switching element and controlling on/off of the second switching element and turning off the second switching element in a case where a current detected by the current detection unit exceeds a threshold value.

According to an embodiment of the present disclosure, a power conversion device converting and outputting a characteristic of input power, the power conversion device, includes a power conversion unit including a normally-on type first switching element made of a nitride-based semiconductor material and converting the characteristic of power by a switching operation performed by the first switching element; an operation control unit controlling a switching operation of the first switching element; and an intelligent power switch including a second switching element provided on a power input side of the power conversion unit and configured to turn on/off power input to the power conversion unit; and a protection control unit including a current detection unit detecting a current flowing in the second switching element and controlling on/off of the second switching element and turning off the second switching element in a case where a period during which a current flows in the second switching element exceeds an energization allowable period obtained based on a time dependent characteristic of a current threshold value which varies in accordance with the period during which the current flows.

A method of controlling a power conversion device according to an embodiment of the present disclosure is a method of a power conversion device which converts and outputs a characteristic of input power, and the power conversion device includes a power conversion unit including a normally-on type first switching element made of a nitride-based semiconductor material and converting the characteristic of power by a switching operation performed by the first switching element; an operation control unit controlling a switching operation of the first switching element; an intelligent power switch including a second switching element provided on a power input side of the power conversion unit and turning on/off power input to the power conversion unit and a protection control unit including a current detection unit detecting a current flowing in the second switching element and controlling on/off of the second switching element and turning off the second switching element in a case where a current detected by the current detection unit exceeds a threshold value; and a protection characteristic adjustment unit connected to the operation control unit and the intelligent power switch. Further, the protection characteristic adjustment unit outputs a predetermined adjustment signal to the second switching element in a case where abnormality is detected at the operation control unit.

DETAILED DESCRIPTION

According to a protection device, for example, in Japanese Patent No. 5567508, a control signal needs to be received from outside in order to drive a latch switch type electromagnetic relay because a protective function is achieved by driving the latch switch type electromagnetic relay to a releasing side.

The present disclosure is made in view of the above-described situation, and there is a need for providing an (electric) power conversion device and a control method therefor capable of automatically interrupting high current.

Solution to Problem

In the following, embodiments of a power conversion device and a method of controlling the same according to the present disclosure will be described in detail with reference to the drawings. Note that the present disclosure is not limited to the embodiments. Additionally, the same reference signs are adequately used to describe the same or equivalent elements among the figures.

First Embodiment

Figure 1:
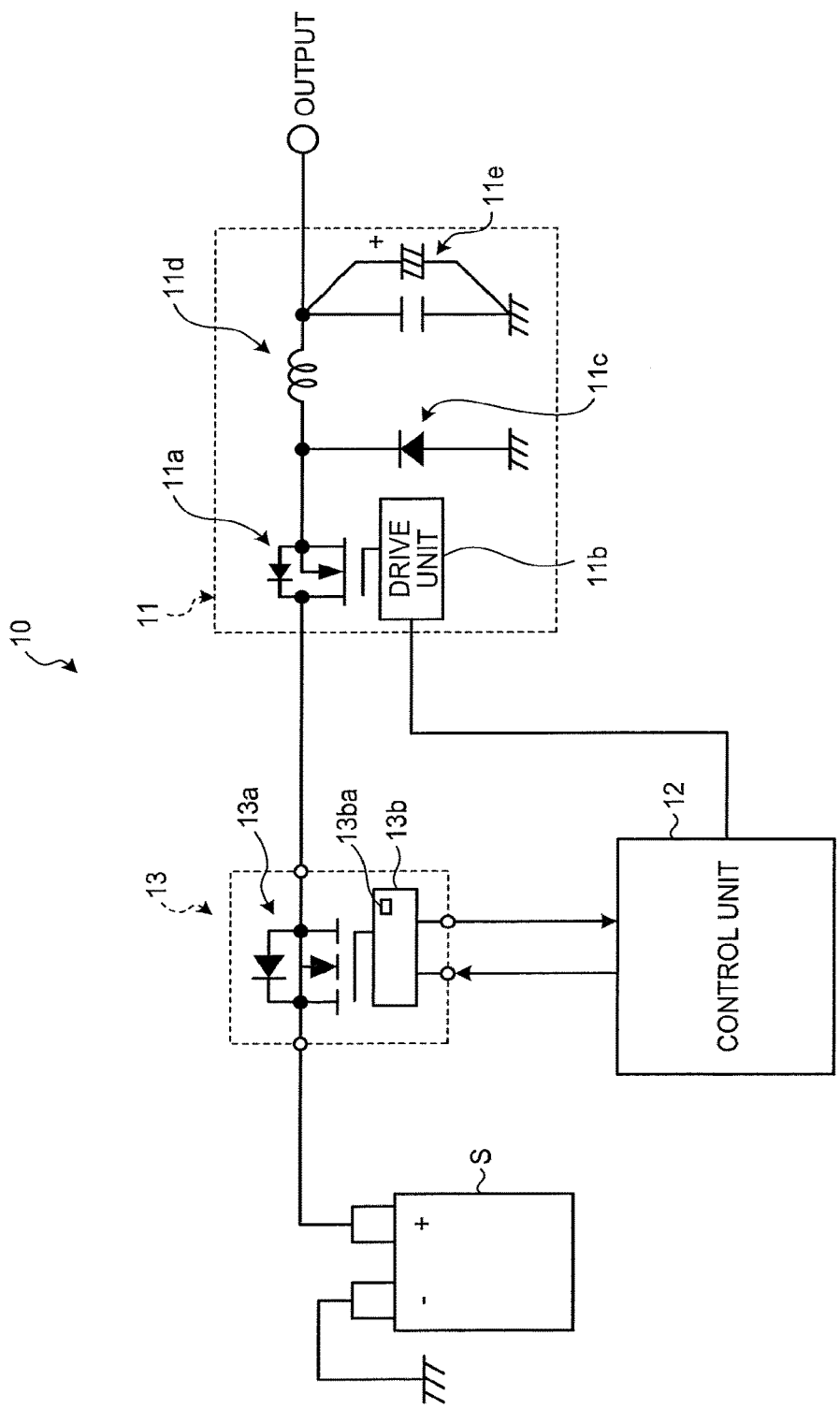
FIG. 1 is a configuration diagram of a power conversion device according to a first embodiment.

FIG. 1 is a configuration diagram of a power conversion device according to a first embodiment. A power conversion device 10 according to the first embodiment functions as a DC-DC converter that steps down and outputs voltage of power output from a battery S provided as a power source.

The power conversion device 10 includes: a DC-DC converter unit 11 provided as a power conversion unit; a control unit 12 provided as an operation control unit; and an intelligent power switch (IPS) 13. The DC-DC converter unit 11 includes a field-effect transistor 11a as a first switching element, a drive unit 11b to drive the field-effect transistor 11a by pulse-width modulation (PWM) driving, a diode 11c, an inductor 11d, and a capacitor unit 11e including two capacitors connected in parallel, and is formed as a step-down DC-DC converter. An electric load is connected to an output side.

The field-effect transistor 11a is a normally-on type field-effect transistor made of a nitride-based semiconductor material. The field-effect transistor 11a has a drain connected to the battery S side, a source connected to the output side, and a gate connected to the drive unit 11b. The drive unit 11b controls on/off of the field-effect transistor 11a by applying a control voltage to the gate of the field-effect transistor 11a. The field-effect transistor 11a turns on power input to an output unit when the drive unit 11b does not apply the control voltage to the gate, and the field-effect transistor 11a turns off power input to the output unit when the drive unit 11b applies a reverse-bias control voltage.

The drive unit 11b applies a PWM signal to the gate of the field-effect transistor 11a and performs PWM driving to execute switching for the field-effect transistor 11a in response to a control signal received from the control unit 12. When the field-effect transistor 11a is switched on, the inductor 11d accumulates energy by DC current flowing from the battery S. When the field-effect transistor 11a is switched off, the inductor 11d emits the accumulated energy. Consequently, induced current flows via the diode 11c. The capacitor unit 11e is provided to smooth voltage. Consequently, the power conversion device 10 can output DC power having an output voltage Vout obtained by stepping down an input voltage Vin from the battery S. Note that a stepped down voltage amount can be adjusted by setting a duty ratio of the PWM signal.

The control unit 12 controls a switching operation of the field-effect transistor 11a by controlling an operation of the drive unit 11b. The control unit 12 is formed by, for example, a microcomputer.

The intelligent power switch 13 is provided on a power input side of the DC-DC converter unit 11, namely, between the battery S and the power input side of the DC-DC converter unit 11 in the first embodiment. The intelligent power switch 13 includes: a field-effect transistor 13a as a second switching element; and a protection control unit 13b.

The field-effect transistor 13a is a normally-off type field-effect transistor, which is, for example, an re-channel power MOSFET. The field-effect transistor 13a has a gate connected to the protection control unit 13b. The protection control unit 13b applies control voltage to the gate of the field-effect transistor 13a to control on/off of the field-effect transistor 13a. In a state that the protection control unit 13b applies the control voltage to the gate, the field-effect transistor 13a turns on power input to the DC-DC converter unit 11 and allows load current to flow from the battery S to the electric load connected on the output side via the DC-DC converter unit 11. On the other hand, when the protection control unit 13b stops applying the control voltage to the gate, power input to the DC-DC converter unit 11 is turned off. Thus, a power supply to the load is stopped when the field-effect transistor 13a is switched from an on state to an off state.

Figure 2:
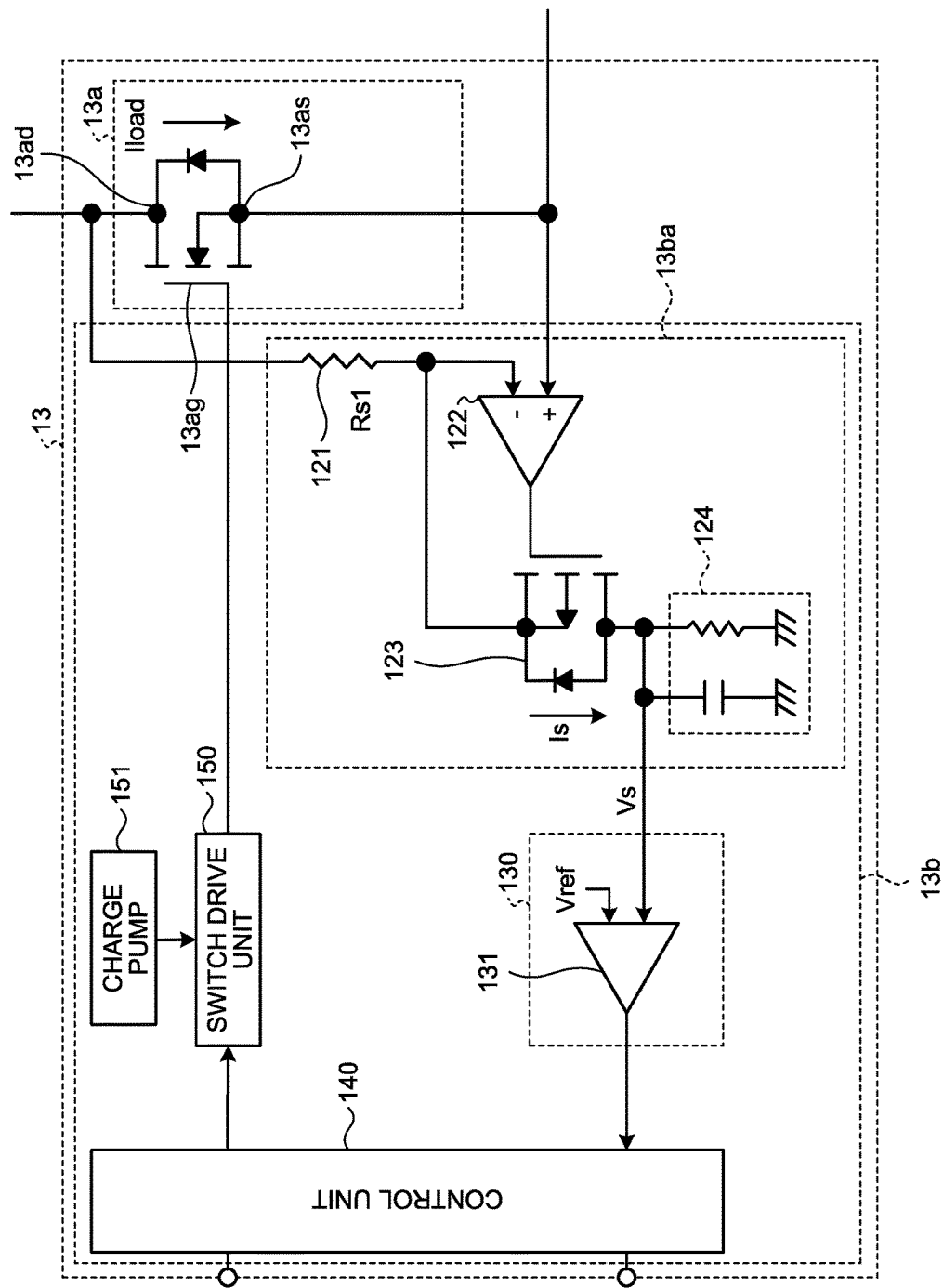
FIG. 2 is a block diagram illustrating a detailed configuration of an intelligent power switch.

Furthermore, the protection control unit 13b includes a current detection unit 13ba adapted to detect current flowing between a drain and a source of the field-effect transistor 13a. The protection control unit 13b exchanges a signal with the control unit 12. The signal includes a signal including information of a current value detected by the current detection unit 13ba. Meanwhile, for the intelligent power switch 13, a commercially available known configuration can be used. Here, the intelligent power switch 13 will be described in detail below. FIG. 2 is a block diagram illustrating a detailed configuration of the intelligent power switch 13.

As illustrated in FIG. 2, the intelligent power switch 13 includes: the field-effect transistor 13a as a semiconductor switch; the current detection unit 13ba constituting the protection control unit 13b; an abnormality detection unit 130; a control unit 140; and a switch drive unit 150. The current detection unit 13ba detects an external load, namely, a load current Iload supplied to the DC-DC converter unit 11 via the field-effect transistor 13a. The abnormality detection unit 130 detects overcurrent and overheat in the field-effect transistor 13a. When an abnormality is detected by the abnormality detection unit 130, the control unit 140 connected to the external control unit 12 controls so that the field-effect transistor 13a is turned off. The switch drive unit 150 controls on/off of the field-effect transistor 13a. The switch drive unit 150 is connected to a charge pump 151 adapted to step up a voltage to a voltage needed to turn on the field-effect transistor 13a.

The field-effect transistor 13a has a drain terminal 13ad connected to the battery S and a source terminal 13as connected to the DC-DC converter unit 11. A gate terminal 13ag is connected to the charge pump 151 via the switch drive unit 150. When the switch drive unit 150 is controlled by the control unit 140 to output a predetermined drive voltage from the charge pump 151 to the gate terminal 13ag, the field-effect transistor 13a is turned on and the load current (Iload) flows from the battery S toward the DC-DC converter unit 11. On the other hand, when the drive voltage is no longer input to the gate terminal 13ag from the charge pump 151, the field-effect transistor 13a is switched from the on state to the off state, and a power supply to the DC-DC converter unit 11 is stopped.

The current detection unit 13ba includes: a temperature compensation circuit 121; a differential amplifier 122; a P-channel MOSFET 123; and an I/V conversion circuit 124. The temperature compensation circuit 121 is formed of a temperature sensitive resistor having a resistance value (defined as Rs1) varied by a temperature, and has one end (input side) connected to the battery S and the other end (output side) connected to an inverse input terminal of the differential amplifier 122. The differential amplifier 122 has a non-inverting input terminal connected to a wire connecting the field-effect transistor 13a to the DC-DC converter unit 11. The differential amplifier 122 has an output terminal connected to a gate terminal of the P-channel MOSFET 123. The P-channel MOSFET 123 has a drain terminal and a source terminal respectively connected to an output side of the temperature compensation circuit 121 and the I/V conversion circuit 124.

With the above-described configuration of the current detection unit 13ba, a current Is (sense current Is) flowing in the P-channel MOSFET 123 is adjusted such that voltage on the source terminal 13as side of the field-effect transistor 13a becomes equal to voltage on an output side of the temperature compensation circuit 121. Since both the drain terminal 13ad of the field-effect transistor 13a and the input side of the temperature compensation circuit 121 are connected to the battery S, the sense current Is is to be a current value obtained when a drain-source voltage Vds of the field-effect transistor 13a is equal to an inter-terminal voltage of the temperature compensation circuit 121. In other words, the sense current Is represents the current value proportional to the load current Iload flowing in the field-effect transistor 13a, and a proportion coefficient thereof can be derived from a resistance value Rds of the field-effect transistor 13a and the resistance value Rs1 of the temperature compensation circuit 121.

As described above, since the sense current Is flowing in the P-channel MOSFET 123 is proportional to the load current Iload, the load current Iload can be detected by using the sense current Is. The larger the resistance value Rs1 of the temperature compensation circuit 121 is, the smaller the sense current Is is. The sense current Is is converted to voltage at the I/V conversion circuit 124 and output to the abnormality detection unit 130 as a sense voltage Vs.

The abnormality detection unit 130 includes a comparator 131 and has a function to detect and protect overcurrent and overheat in the field-effect transistor 13a. The comparator 131 has two input terminals, the sense voltage Vs that is output from the current detection unit 13ba is input to one input terminal, and a predetermined interruption threshold value Vref is input to the other input terminal. The interruption threshold value Vref is set such that a current value corresponding to the interruption threshold value Vref satisfies an overcurrent protection characteristic of the field-effect transistor 13a.

The comparator 131 compares the sense voltage Vs with the interruption threshold value Vref, and when the sense voltage Vs becomes larger than the interruption threshold value Vref, an abnormality detection signal is output to the control unit 140. Consequently, the field-effect transistor 13a in the intelligent power switch 13 is interrupted as described later.

The control unit 140 outputs a predetermined control signal to the switch drive unit 150 in accordance with an operation signal received from the external control unit 12. In other words, when an operation signal requesting activation of the DC-DC converter unit 11 is received from the external control unit 12, the control unit 140 outputs a control signal to turn on the field-effect transistor 13a to the switch drive unit 150. When an operation signal to stop supply of power from to the DC-DC converter unit 11 is received from the control unit 12, a control signal to turn off the field-effect transistor 13a is output to the switch drive unit 150. The control unit 140 also receives the abnormality detection signal from the abnormality detection unit 130 and outputs the abnormality detection signal to the switch drive unit 150. The abnormality detection signal normally output is a signal indicating non-detection of abnormality, and the signal is switched to a signal indicating detection of abnormality when an abnormality is detected by the abnormality detection unit 130.

The switch drive unit 150 does not apply drive voltage from the charge pump 151 to the gate terminal 13ag of the field-effect transistor 13a when a control signal to turn off the field-effect transistor 13a is received from the control unit 140. Consequently, the field-effect transistor 13a becomes the off state, and a power supply from the battery S to the DC-DC converter unit 11 is stopped. When a control signal to turn on the field-effect transistor 13a is received from the control unit 140 and also the abnormality detection signal indicates non-detection of abnormality, a predetermined drive voltage is applied to the gate terminal 13ag of the field-effect transistor 13a from the charge pump 151. Consequently, the field-effect transistor 13a becomes the on state, and power is supplied from the battery S to the DC-DC converter unit 11.

When the abnormality detection signal received from the control unit 140 is switched from non-detection of abnormality to detection of abnormality when the field-effect transistor 13a is in the on state, the field-effect transistor 13a is switched to the off state even though the control signal received from the control unit 140 is the signal to turn on the field-effect transistor 13a. Consequently, the power supply from the battery S to the DC-DC converter unit 11 is stopped.

As described above, when the current detected by the current detection unit 13ba exceeds the threshold value, the protection control unit 13b stops applying the control voltage to the gate so as to turn off the field-effect transistor 13a. Here, the threshold value is set to a large value deemed as overcurrent for the DC-DC converter unit 11. Consequently, a high current flowing from the battery S to the DC-DC converter unit 11, particularly, in the field-effect transistor 11a of the DC-DC converter unit 11 can be interrupted. Such current interruption is automatically performed by the intelligent power switch 13 regardless of external control. Consequently, an expansion of a failure in the power conversion device 10 can be prevented.

Figure 3:
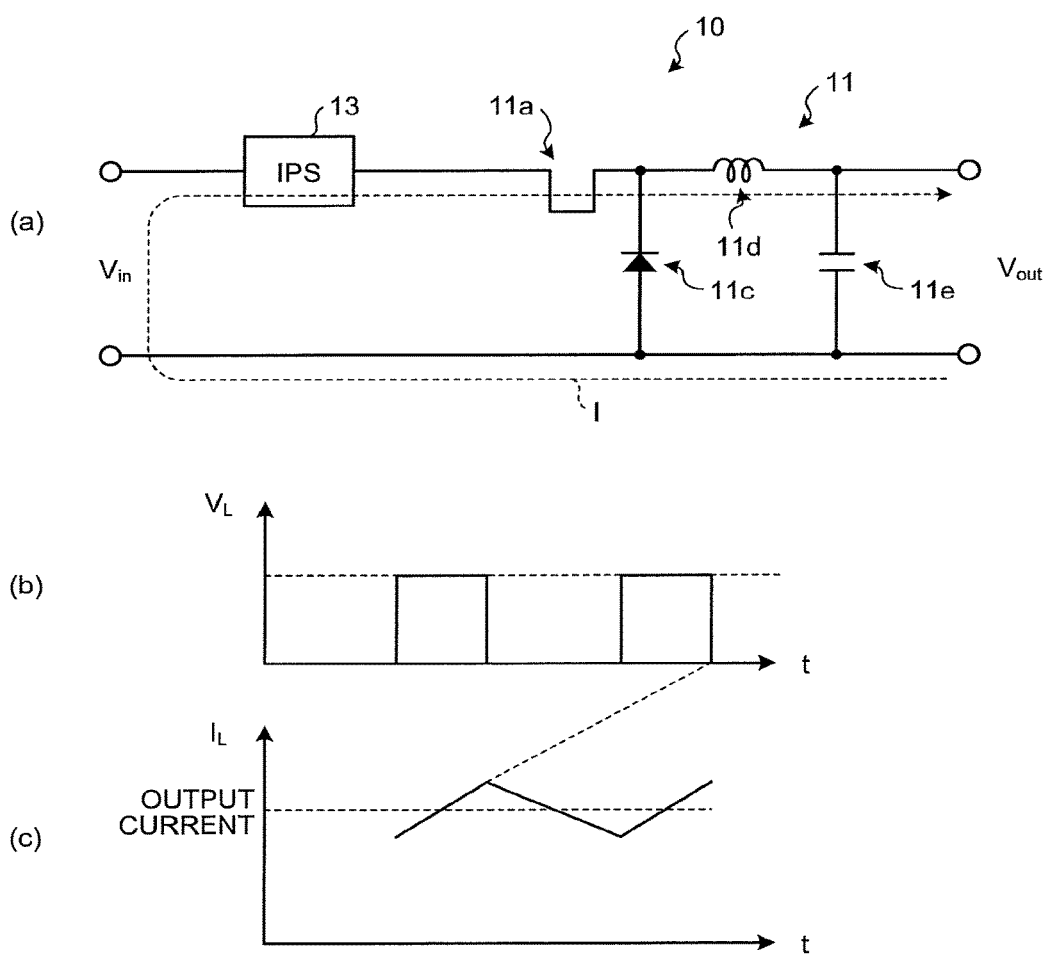
FIG. 3 is a diagram illustrating a case where a high current flows in the power conversion device illustrated in FIG. 1.

FIG. 3 is a diagram illustrating a case where a high current flows in the power conversion device 10 illustrated in FIG. 1. Note that illustration of the control unit 12 and the like are omitted in FIG. 3 to simplify the drawing.

A PWM signal is applied from the drive unit 11b to a gate portion of the field-effect transistor 11a, but a current I may flow as illustrated in part (a) of FIG. 3 when a failure occurs at this gate portion. Here, as illustrated in part (b) of FIG. 3, when the gate portion of the field-effect transistor 11a is functioning normally, a voltage $V_L$ between the terminals of the inductor 11d is periodically increased and decreased in accordance with a characteristic of the PWM signal as indicated by a solid line. However, when a failure occurs at the gate portion, the voltage $V_L$ comes to have a constant value as indicated by a broken line and becomes, for example, a large value which corresponds to a maximum value of the voltage $V_L$ obtained when the gate portion functions normally.

Additionally, as illustrated in part (c) of FIG. 3, when the gate portion of the field-effect transistor 11a functions normally, a current $I_L$ flowing in the inductor 11d is periodically increased and decreased in accordance with the characteristic of the PWM signal as indicated by a solid line, and an average value thereof is a value of output current. However, when a failure occurs at the gate portion, the current $I_L$ is increased. In the event of failure at the gate portion, the current $I_L$ may become approximately 50 times or more, furthermore, 100 times or more of a value during a normal operation. The current I also becomes to have a value which is substantially equal to the current $I_L$.

For example, a case is considered where the power conversion device 10 is a step-down DC-DC converter having an output voltage of 3 kW, an input voltage Vin of 48 V, and an output voltage Vout of 12 V. In this case, an output current during a normal operation is 250 A, but when a failure occurs, the output current becomes (48 V−12 V)/3 mΩ2=12 kA, which is approximately 50 times of the value during the normal operation, provided that a resistance value of the field-effect transistor 11a in the event of the failure is 3 mΩ.

However, in the power conversion device 10 according to the first embodiment, in the case where the current detected by the current detection unit 13ba of the intelligent power switch 13 exceeds the threshold value, the protection control unit 13b stops applying control voltage to the gate so as to turn off the field-effect transistor 13a as described above. As a result, the current I can be interrupted on an upstream side of the power conversion device 10. Consequently, an expansion of a failure in the power conversion device 10 can be prevented.

Here, the threshold value may have a characteristic in which the longer an energization period from the battery S to the DC-DC converter unit 11 becomes longer (period during which a current flows in the field-effect transistor 13a) is, the more decreased the threshold value is, and afterward, the threshold value is kept at a substantially constant value. The reason is that: in a case where the power conversion device 10 is mounted on, for example, a vehicle and an electric load is an on-vehicle electrical component, the DC-DC converter unit 11 can allow a relatively high current to flow for a short period in accordance with a load current characteristic such as an incoming current of a lamp or a motor, but when the energization period becomes longer, an upper limit of a current value that can be made to flow is more decreased. The protection control unit 13b stores such a characteristic of the threshold value and may have a configuration to update the threshold value in accordance with the energization period of the current detected by the current detection unit 13ba.

Additionally, the protection control unit 13b obtains an energization allowable period (hereinafter referred to as an "overcurrent detection determining period") based on a time dependent characteristic of the threshold value in accordance with a level of an energization current of the field-effect transistor 13a detected by the current detection unit 13ba, and can use this energization allowable period as a limit value for the energization period of overcurrent. As described above, the threshold value is an allowable current value set in accordance with a protection target, and also is a value depending on the energization period. In this case, in the case where the energization period exceeds the overcurrent detection determining period, the protection control unit 13b controls the field-effect transistor 13a to be turned off, thereby achieving appropriate protection for the DC-DC converter unit 11 (particularly, the field-effect transistor 11a).

Second Embodiment

Figure 4:
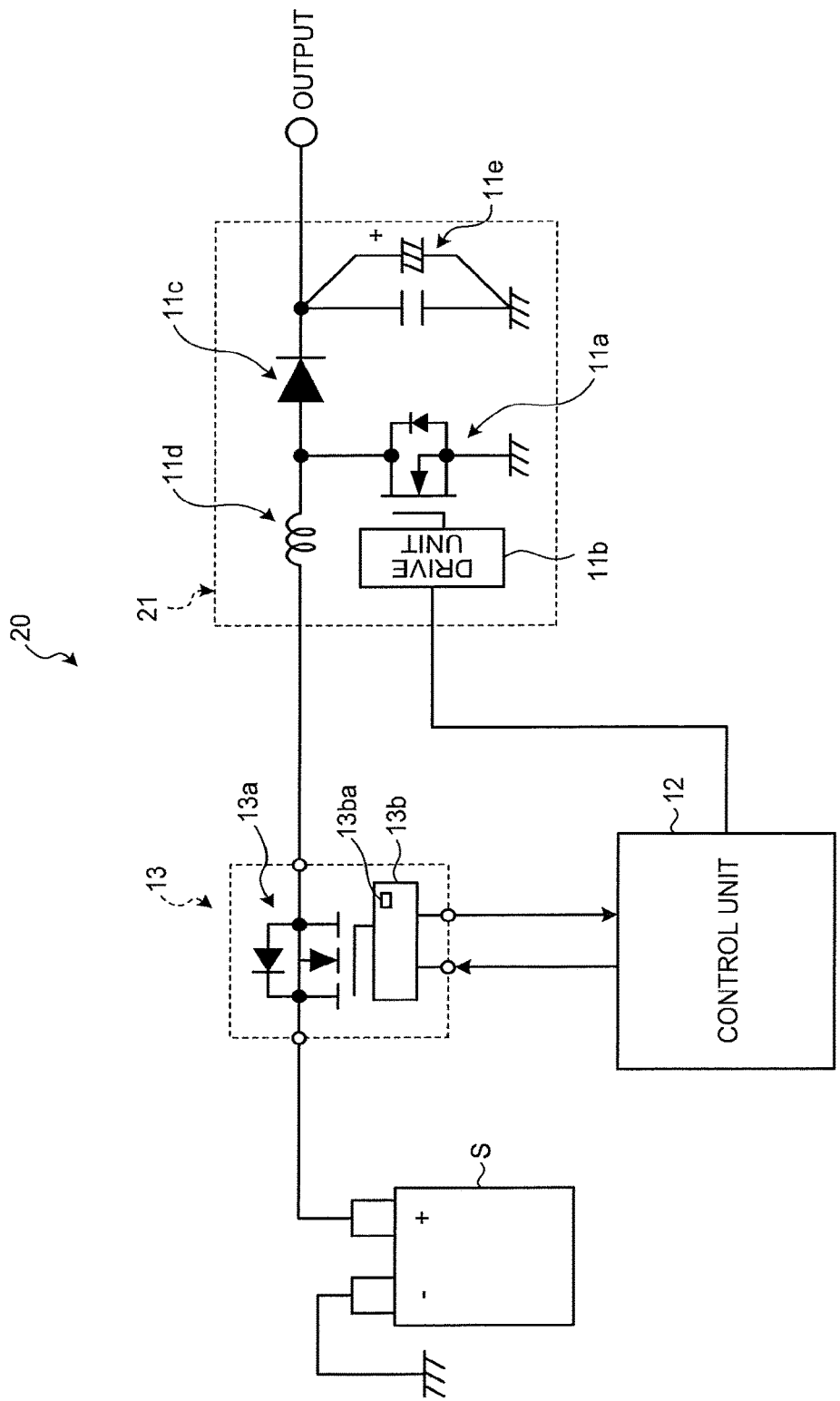
FIG. 4 is a configuration diagram of a power conversion device according to a second embodiment.

FIG. 4 is a configuration diagram of a power conversion device according to a second embodiment. A power conversion device 20 according to the second embodiment functions as a DC-DC converter adapted to step up and output a voltage of power output from a battery S provided as a power source.

The power conversion device 20 includes: a DC-DC converter unit 21 provided as a power conversion unit; a control unit 12; and an intelligent power switch 13. In the following, a description for the control unit 12 and the intelligent power switch 13 is omitted, and the DC-DC converter unit 21 will be described.

The DC-DC converter unit 21 includes: a field-effect transistor 11a; a drive unit 11b to drive the field-effect transistor 11a by PWM driving; a diode 11c; an inductor 11d; and a capacitor unit 11e including two capacitors connected in parallel, and is formed as a step-up DC-DC converter.

The drive unit 11b applies a PWM signal to a gate of the field-effect transistor 11a and performs PWM driving to execute switching for the field-effect transistor 11a in response to a control signal received from the control unit 12. When the field-effect transistor 11a is switched on, the inductor 11d accumulates energy by a DC current flowing from the battery S. When the field-effect transistor 11a is switched off, the inductor 11d emits the accumulated energy. As a result, the energy accumulated in the inductor 11d is added to input power from the battery S. Consequently, the power conversion device 20 can output DC power having an output voltage Vout obtained by stepping up an input voltage Vin applied from the battery S. A stepped up voltage amount can be adjusted by setting a duty ratio of the PWM signal.

In this power conversion device 20 as well, in a case where a current detected by a current detection unit 13ba of the intelligent power switch 13 exceeds a threshold value, a protection control unit 13b applies a control voltage to a gate so as to turn off the field-effect transistor 13a. Here, the threshold value is set to a large value deemed as overcurrent for the DC-DC converter unit 21. Consequently, a high current flowing from the battery S to the DC-DC converter unit 21, particularly, in the field-effect transistor 11a of the DC-DC converter unit 21 can be interrupted. Such current interruption is automatically performed by the intelligent power switch 13 regardless of external control. Consequently, an expansion of a failure in the power conversion device 20 can be prevented.

Figure 5:
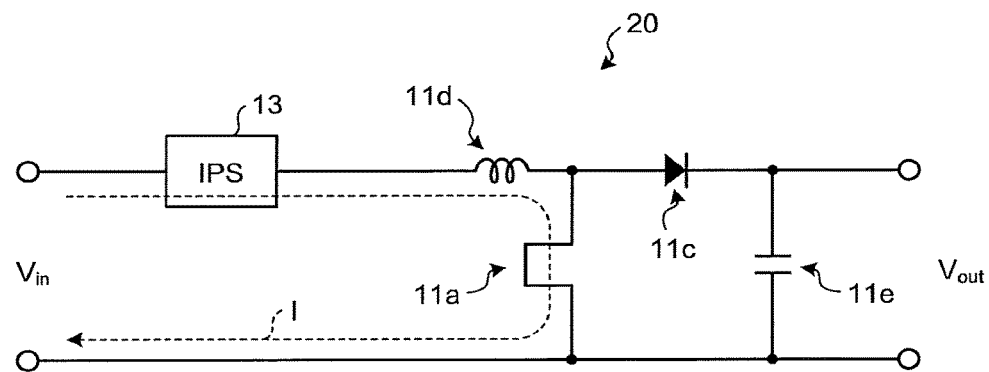
FIG. 5 is a diagram illustrating a case where a high current flows in the power conversion device illustrated in FIG. 4.

FIG. 5 is a diagram illustrating a case where a high current flows in the power conversion device 20 illustrated in FIG. 4. Note that illustration of the control unit 12 and the like is omitted in FIG. 5 to simplify the drawing.

A PWM signal is applied from the drive unit 11b to a gate portion of the field-effect transistor 11a, but a current I may flow as illustrated in FIG. 5 when a failure occurs at this gate portion. However, in the power conversion device 20 according to the second embodiment, in the case where the current detected by the current detection unit 13ba of the intelligent power switch 13 exceeds the threshold value, the protection control unit, 13b applies a control voltage to the gate so as to turn off the field-effect transistor 13a as described above. As a result, the current I is interrupted on an upstream side of the power conversion device 20. Consequently, an expansion of a failure in the power conversion device 20 can be prevented.

Meanwhile, the power conversion unit is a DC-DC converter in the above-described embodiment, but the present disclosure is not limited thereto and may also be adaptable to, for example, a power conversion device including a power conversion unit that converts a characteristic of input power, such as an inverter.

Additionally, the intelligent power switch 13 automatically interrupts the current regardless of external control in the above embodiment, but the present disclosure is not limited thereto. For example, in the case where current detected by the current detection unit 13*ba* of the intelligent power switch 13 is output to an external control unit and the current received in the control unit exceeds a threshold value, the control unit may be adapted to output, to the protection control unit 13*b*, a control signal to turn off the field-effect transistor 13*a*. With this configuration, the intelligent power switch 13 automatically interrupts the current by control from the outside.

Furthermore, the present disclosure is not limited to the above-described embodiments. The present disclosure may also include a configuration obtained by appropriately combining the above-described respective constituent elements. Also, additional effects and a modified example can be easily derived by a person skilled in the art. Therefore, a broad aspect of the present disclosure is not limited to the above-described embodiments, and various modifications may be made.

For example, as a first modified example of the above-described embodiments, the control unit 12 may include a monitoring/protecting unit to monitor/protect the field-effect transistor 13*a* and a power supply line from the battery S to the output via the DC-DC converter unit. The field-effect transistor 13*a* and the power supply line are provided with respective limits for overcurrent, and the monitoring/protecting unit monitors both of those limits. The overcurrent protection characteristic is set for the field-effect transistor 13*a* as the limit for overcurrent. Additionally, an electric wire smoking characteristic to prevent an electric wire from being heated and emitting smoke is set for the power supply line. Since the control unit 12 can detect, with high accuracy, the current to energize the field-effect transistor 13*a* via the current detection unit 13*ba* of the protection control unit 13*b*, it is possible to monitor overcurrent based on the detected current with high accuracy.

Figure 6:
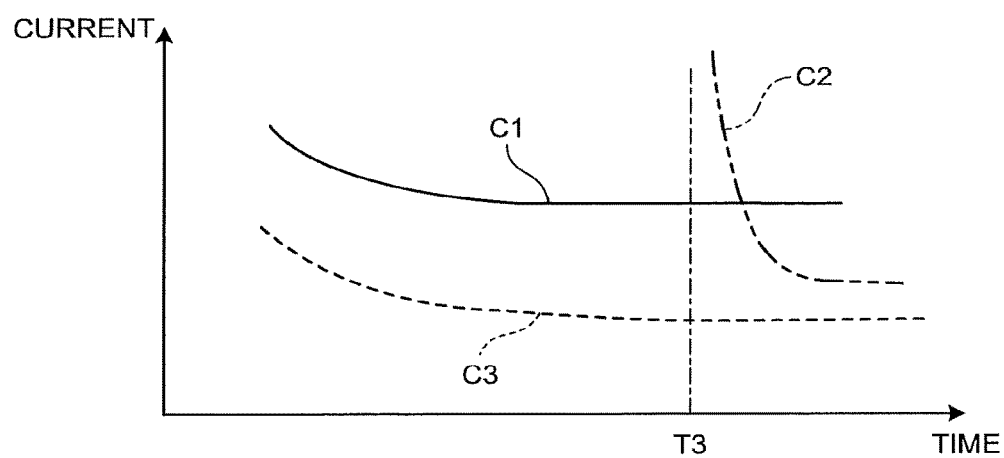
FIG. 6 is a diagram illustrating an example of an overcurrent protection characteristic of a field-effect transistor and an electric wire smoking characteristic of a power supply line.

FIG. 6 illustrates examples of an overcurrent protection characteristic of the field-effect transistor 13*a* and an electric wire smoking characteristic of the power supply line. In FIG. 6, a horizontal axis represents time and a vertical axis represents current respectively, and the overcurrent protection characteristic and the electric wire smoking characteristic are indicated by reference signs C1 and C2 respectively. Note that the number of the overcurrent protection characteristic and the number of the electric wire smoking characteristic monitored by the monitoring/protecting unit are not limited to one, and may be two or more, respectively.

The overcurrent protection characteristic C1, namely, a limit for overcurrent of the field-effect transistor 13*a* indicates that: relatively high current can be made to flow for a short period, but when the period becomes longer, a current value that can be made to flow for a long time is decreased accordingly. Additionally, the electric wire smoking characteristic C2, namely, a limit to prevent the power supply line from emitting smoke indicates that: a high current can flow for a short period but when the period of current flow becomes longer after time T3, a current value is needed to be decreased rapidly. The characteristics in response to an overcurrent illustrated in FIG. 6 indicate that: in the case of a short period, the overcurrent protection characteristic C1 denotes as an upper limit of allowable current, and in the case of a long period, the electric wire smoking characteristic C2 denotes the upper limit.

The monitoring/protecting unit of the control unit 12 monitors and protects both the field-effect transistor 13*a* and the power supply line, and monitors the overcurrent protection characteristic C1 and the electric wire smoking characteristic C2 for each thereof. When an abnormality in which current exceeds the limit based on the overcurrent protection characteristic C1 or the electric wire smoking characteristic C2 is detected in the monitoring/protecting unit, the field-effect transistor 13*a* or the power supply line in which the current exceeds the limit can be protected by turning off the field-effect transistor 13*a* to interrupt current.

Additionally, when an abnormality of the control unit 12 is detected, a predetermined adjustment signal is output to the field-effect transistor 13*a* from a protection characteristic adjustment unit (not illustrated) connected to both the control unit 12 and the intelligent power switch 13. When the adjustment signal is received from the protection characteristic adjustment unit, the field-effect transistor 13*a* maintains the on state and allows the protection control unit 13*b* to monitor/protect both the overcurrent protection characteristic C1 and the electric wire smoking characteristic C2. Furthermore, when the field-effect transistor 13*a* is in the off state, the off state is maintained.

Additionally, in the present first modified example, the protection control unit 13*b* normally has the overcurrent protection characteristic C1 set as a monitoring setting value (threshold value) with respect to the energization current of the field-effect transistor 13*a*, but when an adjustment signal is received from the protection characteristic adjustment unit, the setting value is changed to a setting value by which both the overcurrent protection characteristic C1 and the electric wire smoking characteristic C2 can be monitored.

As illustrated in FIG. 6, when predetermined current flows for a short period, the overcurrent protection characteristic C1 functions as the limit value for overcurrent, but when the current flows for a long period, the electric wire smoking characteristic C2 functions as the limit value. Therefore, for example, a setting value of C3 illustrated in FIG. 6 is used in the protection control unit 13*b* as a setting value by which both the overcurrent protection characteristic C1 and the electric wire smoking characteristic C2 can be monitored. Consequently, both the field-effect transistor 13*a* and the power supply line can be monitored.

Therefore, according to the present first modified example, even when abnormality occurs in the control unit 12, the field-effect transistor 13*a* adapted to control the power supply to the DC-DC converter unit can be kept in the on state. Additionally, when an overcurrent is detected by the protection control unit 13*b* that is a self-protection means of the field-effect transistor 13*a* by the intelligent power switch 13, the intelligent power switch 13 turns off current to protect itself. Therefore, system security can be improved.

A Power conversion device according to a second modified example can be provided, for example, by adding a sleep detection unit described below to the power conversion device according to the embodiments of the present disclosure or the first modified example thereof. The sleep detection unit detects a state (sleep state) in which a power amount output from the battery S is reduced after a predetermined period has elapsed from when a main switch of a vehicle is turned off. When the sleep detection unit detects the sleep state, the power conversion device lowers the output voltage Vout which is stepped down from the input voltage Vin from the battery S to a minimum operation voltage at which the electric load is operable, and supplies the output voltage Vout to the load. By doing this, the voltage of power to be supplied is decreased, for example, from 12 V to 6 V, thus a power consumption amount of the electric load in the sleep state can be reduced, and therefore a service lifetime of the battery S can be prolonged. Additionally, a battery state detection unit to detect a state of the battery S may also be provided in place of the sleep detection unit to detect the sleep state in the power conversion device according to the embodiments of the present disclosure or the first modified example thereof. The battery state detection unit is capable of detecting a state of charge (SOC) and a state of health (SOH) of the battery S. When the battery state detection unit detects decrease of the SOC or SOH, the power conversion device supplies a power to a load lowers the output voltage Vout which is stepped down from the input voltage Vin from the battery S to a minimum operation voltage at which the electric load is operable, and supplies the output voltage Vout to the load, and supplies the output voltage Vout to the load. by doing this, the power consumption amount of the electric load can be reduced after the detection of the lowering of the SOC and SOH, and thus the service lifetime of the battery S can be prolonged.

Particularly, in the power conversion device according to the embodiments of the present disclosure and the respective modified examples thereof, a normally-on type first switching element is used for the DC-DC converter unit. As described above, the normally-on type switching element has a gate capacity smaller than that of a normally-off type switching element, and also can reduce on-resistance. Therefore, in the power conversion device according to the embodiments of the present disclosure and the respective modified examples thereof, a switching loss during an operation of the DC-DC converter unit is reduced, and the power consumption amount can be reduced. By doing this, a power consumption of the DC-DC converter unit at the time of the above-described sleep state can also be reduced, and thus the service lifetime of the battery S can further be prolonged.

INDUSTRIAL APPLICABILITY

As described above, the power conversion device and the method of controlling the same according to the present disclosure may be mounted on, for example, a vehicle and may be used to control voltage of the DC-DC converter unit in accordance with a vehicle state, and may also be applied to an AC inverter.

According to the present disclosure, in a case where the current detected by the intelligent power switch exceeds the threshold value or in a case where the period during which the current flows in the second switching element exceeds the energization allowable period, a power supply to the current converting unit is interrupted. Therefore, there is an effect can be achieved that the power conversion device and the method of controlling the same are capable of automatically interrupting a high current regardless of an external control.

The invention claimed is:
1. A power conversion device receiving an input electric power, converting the input electric power, and outputting a converted electric power, the power conversion device comprising:
a power conversion unit including a normally-on type first switching element made of a nitride-based semiconductor material and configured to convert the input power by a switching operation performed by the first switching element;
an operation control unit configured to control the switching operation of the first switching element; and
an intelligent power switch including:
a second switching element provided on a power input side of the power conversion unit and configured to turn on/off power input to the power conversion unit;
a current detection unit including a temperature sensitive resistor of which resistance varies with a temperature thereof, the temperature sensitive resistor being provided in parallel with the second switching element, the current detection unit being configured to compare a voltage across the temperature sensitive resistor with a voltage across the second switching element, thereby to detect a current flowing in the second switching element; and
a protection control unit configured to control on/off of the second switching element and turn off the second switching element in a case where the current detected by the current detection unit exceeds a threshold value,
wherein the threshold value varies in accordance with a period during which a current flows in the second switching element.

2. The power conversion device according to claim 1, wherein the power conversion unit is a DC-DC converter.

3. A power conversion device receiving an input electric power, converting the input electric power, and outputting a converted electric power, the power conversion device comprising:
a power conversion unit including a normally-on type first switching element made of a nitride-based semiconductor material and configured to convert the input power by a switching operation performed by the first switching element;
an operation control unit configured to control the switching operation of the first switching element; and
an intelligent power switch including:
a second switching element provided on a power input side of the power conversion unit and configured to turn on/off power input to the power conversion unit;
a current detection unit including a temperature sensitive resistor of which resistance varies with a temperature thereof, the temperature sensitive resistor being provided in parallel with the second switching element, the current detection unit being configured to compare a voltage across the temperature sensitive resistor with a voltage across the second switching element, thereby to detect a current flowing in the second switching element; and
a protection control unit configured to control on/off of the second switching element and turn off the second switching element in a case where a period during which a current flows in the second switching element exceeds an energization allowable period obtained based on a time dependent characteristic of a current threshold value which varies in accordance with the period during which the current flows.

4. The power conversion device according to claim 3, wherein the power conversion unit is a DC-DC converter.

5. A method of controlling a power conversion device, the power conversion device receives an input electric power, converts the input electric power, and outputs a converted electric power, the power conversion device includes a power conversion unit including a normally-on type first switching element made of a nitride-based semiconductor material and configured to convert the input power by a switching operation performed by the first switching element, an operation control unit configured to control the switching operation of the first switching element, an operation control unit configured to control the switching operation of the first switching element, and an intelligent power switch, the intelligent power switch including a second switching element provided on a power input side of the power conversion unit and configured to turn on/off power input to the power conversion unit, a current detection unit including a temperature sensitive resistor of which resistance varies with a temperature thereof, the temperature sensitive resistor being provided in parallel with the second switching element, the current detection unit being configured to compare a voltage across the temperature sensitive resistor with a voltage across the second switching element, thereby to detect a current flowing in the second switching element, and a protection control unit configured to control on/off of the second switching element and turn off the second switching element in a case where the current detected by the current detection unit exceeds a threshold value, wherein the threshold value varies in accordance with a period during which a current flows in the second switching element, the method comprising:

outputting a controlling signal to the second switching element, the controlling signal causing the second switching element to maintain a current operating status, when abnormality is detected in the operation control unit.

6. The control method according to claim 5, wherein in a case where the controlling signal is received in an on state, the second switching element maintains the on state and the protection control unit turns off the second switching element based on the threshold value.

\* \* \* \* \*